(12) United States Patent
Meixner

(10) Patent No.: US 9,123,128 B2
(45) Date of Patent: Sep. 1, 2015

(54) GRAPHICS PROCESSING UNIT EMPLOYING A STANDARD PROCESSING UNIT AND A METHOD OF CONSTRUCTING A GRAPHICS PROCESSING UNIT

(71) Applicant: Nvidia Corporation, Santa Clara, CA (US)

(72) Inventor: Albert Meixner, Mountain View, CA (US)

(73) Assignee: Nvidia Corporation, Santa Clara, CA (US)

( * ) Notice: Subject to any disclaimer, the term of this patent is extended or adjusted under 35 U.S.C. 154(b) by 91 days.

(21) Appl. No.: 13/724,233

(22) Filed: Dec. 21, 2012

(65) Prior Publication Data

US 2014/0176569 A1 Jun. 26, 2014

(51) Int. Cl.
*G06T 1/20* (2006.01)
*H05K 13/00* (2006.01)
*G06F 15/76* (2006.01)
*G06F 9/38* (2006.01)

(52) U.S. Cl.
CPC .............. *G06T 1/20* (2013.01); *G06F 9/3887* (2013.01); *G06F 15/76* (2013.01); *H05K 13/00* (2013.01); *Y10T 29/49* (2015.01)

(58) Field of Classification Search
CPC ......... G06T 1/20; G06T 15/005; G09G 5/363
USPC ......... 345/501, 502, 506, 520, 522, 530, 557, 345/559
See application file for complete search history.

(56) References Cited

U.S. PATENT DOCUMENTS

| | | | | |
|---|---|---|---|---|
| 6,385,632 | B1* | 5/2002 | Choe et al. ................... | 708/270 |
| 6,919,896 | B2* | 7/2005 | Sasaki et al. ................. | 345/505 |
| 7,146,486 | B1* | 12/2006 | Prokopenko et al. ........... | 712/22 |
| 7,158,141 | B2* | 1/2007 | Chung et al. ................. | 345/506 |
| 7,213,136 | B2* | 5/2007 | Sperber et ..................... | 712/245 |
| 7,307,638 | B2* | 12/2007 | Leather et al. ................ | 345/582 |
| 7,568,189 | B2* | 7/2009 | Suba et al. .................... | 717/145 |
| 7,788,468 | B1* | 8/2010 | Nickolls et al. ................ | 712/22 |
| 8,106,914 | B2 | 1/2012 | Oberman et al. | |
| 8,578,129 | B2* | 11/2013 | Blinzer et al. ................ | 711/206 |
| 2008/0030510 | A1* | 2/2008 | Wan et al. ..................... | 345/505 |
| 2009/0307472 | A1* | 12/2009 | Essick, IV et al. ........... | 712/241 |

(Continued)

FOREIGN PATENT DOCUMENTS

TW 200937341 A 9/2009

OTHER PUBLICATIONS

Lee, Y., et al., "Exploring the Tradeoffs between Programmability and Efficiency in Data-Parallel Accelerators," ISCA, Jun. 4-8, 2011, ACM, pp. 129-140.

(Continued)

*Primary Examiner* — Joni Richer

(57) ABSTRACT

Employing a general processing unit as a programmable function unit of a graphics pipeline and a method of manufacturing a graphics processing unit are disclosed. In one embodiment, the graphics pipeline includes: (1) accelerators, (2) an input output interface coupled to each of the accelerators and (3) a general processing unit coupled to the input output interface and configured as a programmable function unit of the graphics pipeline, the general processing unit configured to issue vector instructions via the input output interface to vector data paths for the programmable function unit.

20 Claims, 3 Drawing Sheets

(56) References Cited

U.S. PATENT DOCUMENTS

| | | | |
|---|---|---|---|
| 2011/0078417 | A1 | 3/2011 | Fahs et al. |
| 2011/0279473 | A1 | 11/2011 | Cabral et al. |
| 2012/0266165 | A1* | 10/2012 | Cen et al. .......................... 718/1 |
| 2012/0299943 | A1* | 11/2012 | Merry ........................... 345/589 |
| 2014/0055453 | A1 | 2/2014 | Maxim |
| 2014/0176578 | A1 | 6/2014 | Meixner |

OTHER PUBLICATIONS

Wittenbrink, C. M., et al., "Fermi GF100 GPU Architecture," IEEE Computer Society, Mar./Apr. 2011, pp. 50-59.
German Office Action dated Oct. 22, 2013, Applicant: Nvidia Corporation, 10 pages.

* cited by examiner

1

GRAPHICS PROCESSING UNIT EMPLOYING A STANDARD PROCESSING UNIT AND A METHOD OF CONSTRUCTING A GRAPHICS PROCESSING UNIT

TECHNICAL FIELD

This application is directed, in general, to graphics processing units (GPUs) and, more specifically, to components of a GPU.

BACKGROUND

In traditional GPUs, fixed function units are statically connected together to form a fixed function graphics pipeline. The output packets of each of the fixed function units, or fixed function stages, are designed to match the input packets of the downstream fixed function unit. A more flexible approach is to define the graphics pipeline in software as a program or programs running on a programmable processor. In such a pipeline, the functional stages are implemented in software with data being moved via a regular general purpose memory system.

SUMMARY

In one aspect, a graphics pipeline is disclosed. In one embodiment, the graphics pipeline includes: (1) accelerators, (2) an input output interface coupled to each of the accelerators and (3) a general processing unit coupled to the input output interface and configured as a programmable function unit of the graphics pipeline, the general processing unit configured to issue vector instructions via the input output interface to vector data paths for the programmable function unit.

In another aspect, an apparatus is disclosed. In one embodiment, the apparatus includes: (1) a scalar processing core programmed to emulate a function unit of a graphics pipeline and (2) a memory directly coupled to the scalar processing core and including a graphics register configured to store input and output operands for accelerators of the graphics pipeline.

In yet one other aspect, a method of manufacturing a graphics processing unit is disclosed. In one embodiment, the method includes: (1) coupling a fixed function unit to an input output interface, (2) coupling a general processing unit to the input output interface, (3) programming the general processing unit to emulate a function unit of a graphics pipeline and (4) coupling vector data paths to the input output interface, wherein the vector data paths are associated with the general processing unit function unit.

BRIEF DESCRIPTION

Reference is now made to the following descriptions taken in conjunction with the accompanying drawings, in which.

DETAILED DESCRIPTION

Figure 1:
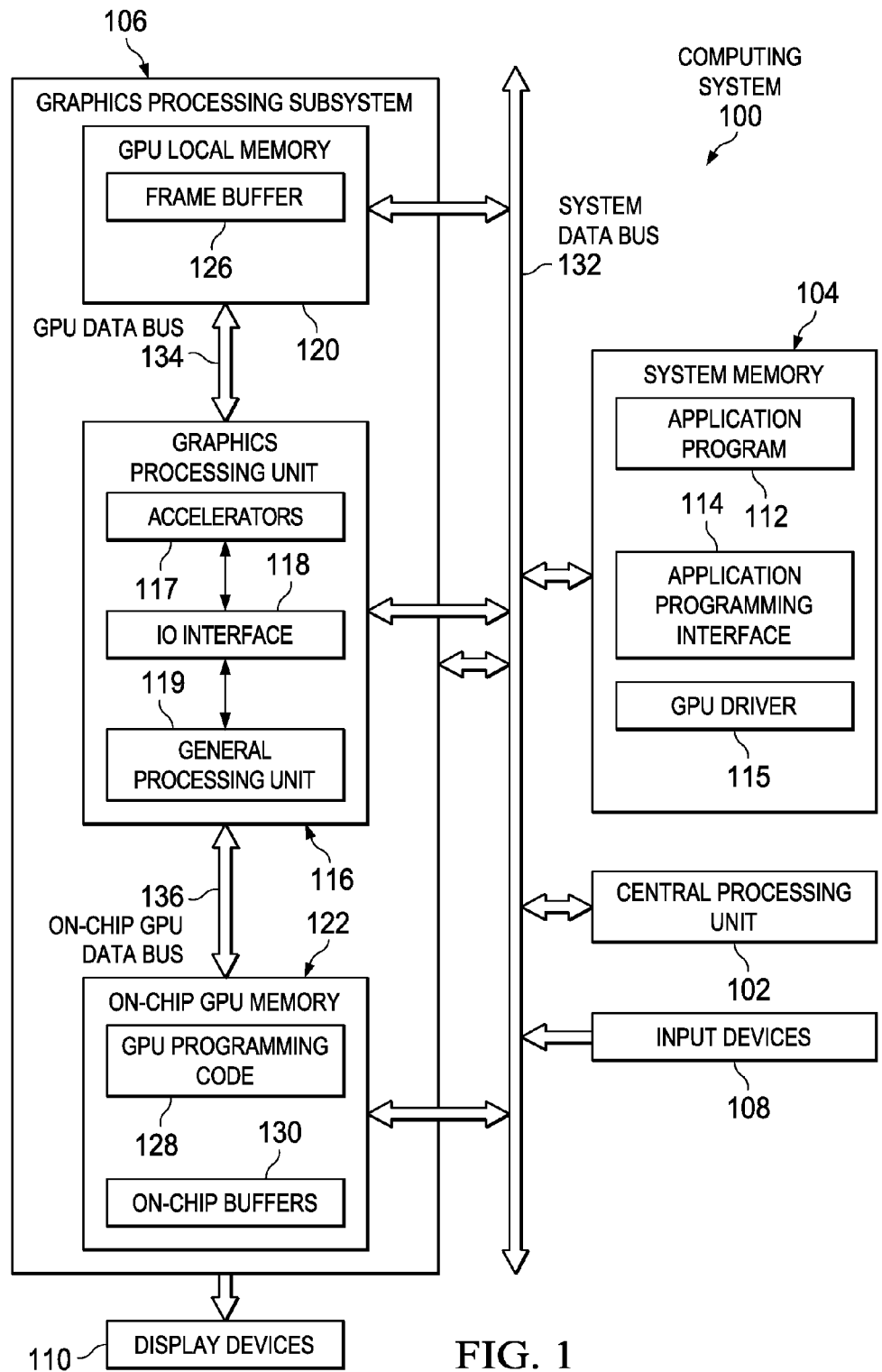
FIG. 1 is a block diagram of an embodiment of a computing system in which one or more aspects of the disclosure may be implemented.

In pipelines with software-defined functional units, a custom processor is typically used to implement the programmable function stages and is built to process parallel code. Thus, the custom processor requires the necessary modifications and associated expense to achieve a processor specifically configured to process parallel code. While well suited for highly parallel code, the special purpose processor is ill-suited for scalar code.

As such, disclosed herein is a programmable graphics pipeline that employs a general processing unit to implement function stages of the pipeline. The programmable graphics pipeline advantageously treats vector data paths of a function stage as accelerators and attaches the vector data paths to an input output interface that provides programmable, non-static connections between stages of the graphics pipeline. The general processing unit is a standard processing unit having a scalar core that is suited for processing scalar code. For example, the general processing unit can be a standard CPU, such as an ARM A9/A15. As disclosed herein the general processing unit also includes a processor memory.

An accelerator is a hardware implemented unit that is used to accelerate processing in the graphics pipeline. An example of an accelerator is a fixed function rasterizer or a texture unit. Thus, the disclosure provides a graphics pipeline architecture having a general processing unit that issues vector instructions into an input output interface as regular graphics requests. A request is a work request to be performed by one of the accelerators. The vector instructions, therefore, can be issued via a control bus connecting the general processing unit to the input output interface. In one embodiment, the input output interface is an input output connector as disclosed in patent application Ser. No. 13/722,901, by Albert Meixner, entitled "AN INPUT OUTPUT CONNECTOR FOR ACCESSING GRAPHICS FIXED FUNCTION UNITS IN A SOFTWARE-DEFINED PIPELINE AND A METHOD OF OPERATING A PIPELINE," filed on the same day as this disclosure and incorporated herein be reference.

The general processing unit includes a processor memory incorporated therein having a graphics register configured to include input and output operands for the vector data paths and the other accelerators of the graphics pipeline.

In one embodiment, the processor memory is an L2 cache. An L2 or level 2 cache is part of a multi-level storage architecture of the general processing unit. In some embodiments the processor memory is built into the motherboard of the general processing unit. The processor memory can be a random access memory (RAM) or another type of volatile memory. The processor memory is used to minimize the latency penalty on the general processing unit for sharing a data-path connecting the general processing unit to the input output interface while still providing large amounts of bandwidth between the processing core of the processing unit and the vector paths.

The size of the processor L2 cache allows for the graphics register included therein to have a large number of active vector registers. In some embodiments, L2 caches are sized at about 256 KB to about 2 MB in size. In these embodiments, about half of the caches are used for registers, so 64K to 512K registers. In one embodiment, a minimum of at least registers per fast memory access (FMA) unit in the vector data paths 237 and 239. As such, the disclosed programmable graphics pipeline enables a large number of graphics threads to tolerate latency.

The general processing unit does not need to be massively multithreaded. In one embodiment, the general processing unit is designed to support one hardware thread context per cooperative thread array (CTA) (4-8 total) in order to run per-CTA pipeline emulation code without requiring software context switches.

In one embodiment, data stored on the processor memory, e.g., input and output operands, is accessed in blocks by the input output interface to maximize bandwidth at a low cost. In one embodiment, the block size is in a range of 64 bytes to 256 bytes.

In one embodiment disclosed herein, a scratch RAM for the processing unit of the programmable graphics pipeline is also implemented as an accelerator. As such, a multi-bank memory is provided as an additional accelerator to support a scratch RAM for the processing unit, which requires highly divergent accesses. In some embodiments, a texture stage of a graphics pipeline can minimize cost by using the scratch RAM accelerator for its data banks, which also require highly divergent accesses.

The graphics pipeline architecture provided herein beneficially allows a lower entry barrier into building a GPU. Because a general processing unit is employed, details involved in building a custom processor are avoided. Additionally, the created accelerators are mostly stateless and easier to design and verify than a full custom processor.

Considering the programmable side, most of the pipeline emulation code would run on a standard scalar core, which lowers the amount of infrastructure, such as compilers, debuggers and profilers, needed and makes it easier to achieve acceptable performance than on a custom scalar core.

Additionally, the disclosed architecture removes or least reduces barriers between a general processing unit and GPU. Switching between scalar and data parallel sections can be done in a few cycles, since the general processing unit has direct access to all vector registers that are stored in the processor memory. As an additional benefit, the general processing unit would have access to all accelerators coupled to the input output interface and could use them directly in otherwise scalar code.

Before describing various embodiments of the novel programmable function unit and methods associated therewith, a computing system within which the general processing unit may be employed in a GPU will be described.

FIG. 1 is a block diagram of one embodiment of a computing system 100 in which one or more aspects of the invention may be implemented. The computing system 100 includes a system data bus 132, a central CPU 102, input devices 108, a system memory 104, a graphics processing subsystem 106, and display devices 110. In alternate embodiments, the CPU 102, portions of the graphics processing subsystem 106, the system data bus 132, or any combination thereof, may be integrated into a single processing unit. Further, the functionality of the graphics processing subsystem 106 may be included in a chipset or in some other type of special purpose processing unit or co-processor.

As shown, the system data bus 132 connects the CPU 102, the input devices 108, the system memory 104, and the graphics processing subsystem 106. In alternate embodiments, the system memory 100 may connect directly to the CPU 102. The CPU 102 receives user input from the input devices 108, executes programming instructions stored in the system memory 104, operates on data stored in the system memory 104 and sends instructions and/or data (i.e., work or tasks to complete) to a graphics processing unit 116 to complete. The system memory 104 typically includes dynamic random access memory (DRAM) used to store programming instructions and data for processing by the CPU 102 and the graphics processing subsystem 106. The graphics processing subsystem 106 receives the transmitted work from the CPU 102 and processes the work employing a graphics processing unit (GPU) 116 thereof. In this embodiment, the GPU 116 completes the work in order to render and display graphics images on the display devices 110. In other embodiments, the GPU 116 or the graphics processing subsystem 106 as a whole can be used for non-graphics processing.

As also shown, the system memory 104 includes an application program 112, an application programming interface (API) 114, and a graphics processing unit (GPU) driver 115. The application program 112 generates calls to the API 114 in order to produce a desired set of results, typically in the form of a sequence of graphics images.

The graphics processing subsystem 106 includes the GPU 116, an on-chip GPU memory 122, an on-chip GPU data bus 136, a GPU local memory 120, and a GPU data bus 134. The GPU 116 is configured to communicate with the on-chip GPU memory 122 via the on-chip GPU data bus 136 and with the GPU local memory 120 via the GPU data bus 134. The GPU 116 may receive instructions transmitted by the CPU 102, process the instructions in order to render graphics data and images, and store these images in the GPU local memory 120. Subsequently, the GPU 116 may display certain graphics images stored in the GPU local memory 120 on the display devices 110.

The GPU 116 includes accelerators 117, an IO interface 118 and a general processing unit 119. The accelerators 117 are hardware implemented processing blocks or units that accelerate the processing of the general processing unit 119. The accelerators 117 include a conventional fixed function unit or units having circuitry configured to perform a dedicated function. The accelerators 117 also include a vector data path or paths and a multi-bank memory that are associated with the general processing unit 119.

The IO interface 118 is configured to couple the general processing unit 119 to each of the accelerators 117 and provide the necessary conversions between software and hardware formats to allow communication of requests and responses between the general processing unit 119 and the accelerators 117. The IO interface 118 provides a programmable pipeline with dynamically defined connections between stages instead of static connections. The IO interface 118 can communicate various states between the general processing unit 119 and the accelerators 117. Inputs and outputs are also translated between a software-friendly format of the general processing unit 119 and a hardware-friendly format of the accelerators. Furthermore, the IO interface 118 translates states between a software-friendly format and a hardware-friendly format. In one embodiment, the IO interface advantageously provides all of the above noted functions in a single processing block that is shared across all of the accelerators 117 and the general processing unit 119. As such, the IO interface advantageously provides a single interface that includes the necessary logic to dynamically connect the general processing unit 119 to the accelerators 117 to form a graphics pipeline and manage instruction level communications therebetween. The IO connector includes multiple components that provide bi-directional connections including bi-directional control connections to the scalar processor core of the general processing unit 119 and bi-directional data connections to the processor memory of the general processing unit 119.

The general processing unit 119 is a standard processor having a scalar core that is suited for processing scalar code. The general processing unit 119 also includes a processor memory that is directly connected to the scalar processor core. By being directly connected, the processor memory is implemented as part of the general processing unit 119 such the scalar processor core can communicate therewith without employing the IO interface 118. Thus, turning briefly to FIG. 2, both the processor memory 214 and the CPU 210 are part of the general processing unit 119 and the CPU 210 does not go through the IO interface 118 to access the processor memory 214. In one embodiment, the CPU 102 may be employed as the general processing unit for the GPU 116 and communicate with the accelerators via the system data bus 132 and the IO interface 118. As such, the CPU 102 can be used with the general processing unit 119 or used instead of the general processing unit 119.

Instead of coexisting as illustrated, in some embodiments the general processing unit 119 replaces the CPU 102 entirely. In this configuration, there's no distinction between the GPU-local memory 120 and the system memory 104. It is replaced with one shared memory. For example, the CPU 102 and system memory 104 can be removed and Application Program 112, API 114, and GPU driver 115 reside in the GPU-local memory 120 and are executed by the General Processing Unit 119. More detail of an embodiment of a graphic pipeline according to the principles of the disclosure is discussed below with respect to FIG. 2.

The GPU 116 may be provided with any amount of on-chip GPU memory 122 and GPU local memory 120, including none, and may use on-chip GPU memory 122, GPU local memory 120, and system memory 104 in any combination for memory operations.

The on-chip GPU memory 122 is configured to include GPU programming code 128 and on-chip buffers 130. The GPU programming 128 may be transmitted from the GPU driver 115 to the on-chip GPU memory 122 via the system data bus 132.

The GPU local memory 120 typically includes less expensive off-chip dynamic random access memory (DRAM) and is also used to store data and programming used by the GPU 116. As shown, the GPU local memory 120 includes a frame buffer 126. The frame buffer 126 stores data for at least one two-dimensional surface that may be used to drive the display devices 110. Furthermore, the frame buffer 126 may include more than one two-dimensional surface so that the GPU 116 can render to one two-dimensional surface while a second two-dimensional surface is used to drive the display devices 110.

The display devices 110 are one or more output devices capable of emitting a visual image corresponding to an input data signal. For example, a display device may be built using a cathode ray tube (CRT) monitor, a liquid crystal display, or any other suitable display system. The input data signals to the display devices 110 are typically generated by scanning out the contents of one or more frames of image data that is stored in the frame buffer 126.

Having described a computing system within which the disclosed programmable graphics pipeline and methods may be embodied or carried out, a particular embodiment of a programmable graphics pipeline will be described in the environment of a GPU 200.

Figure 2:
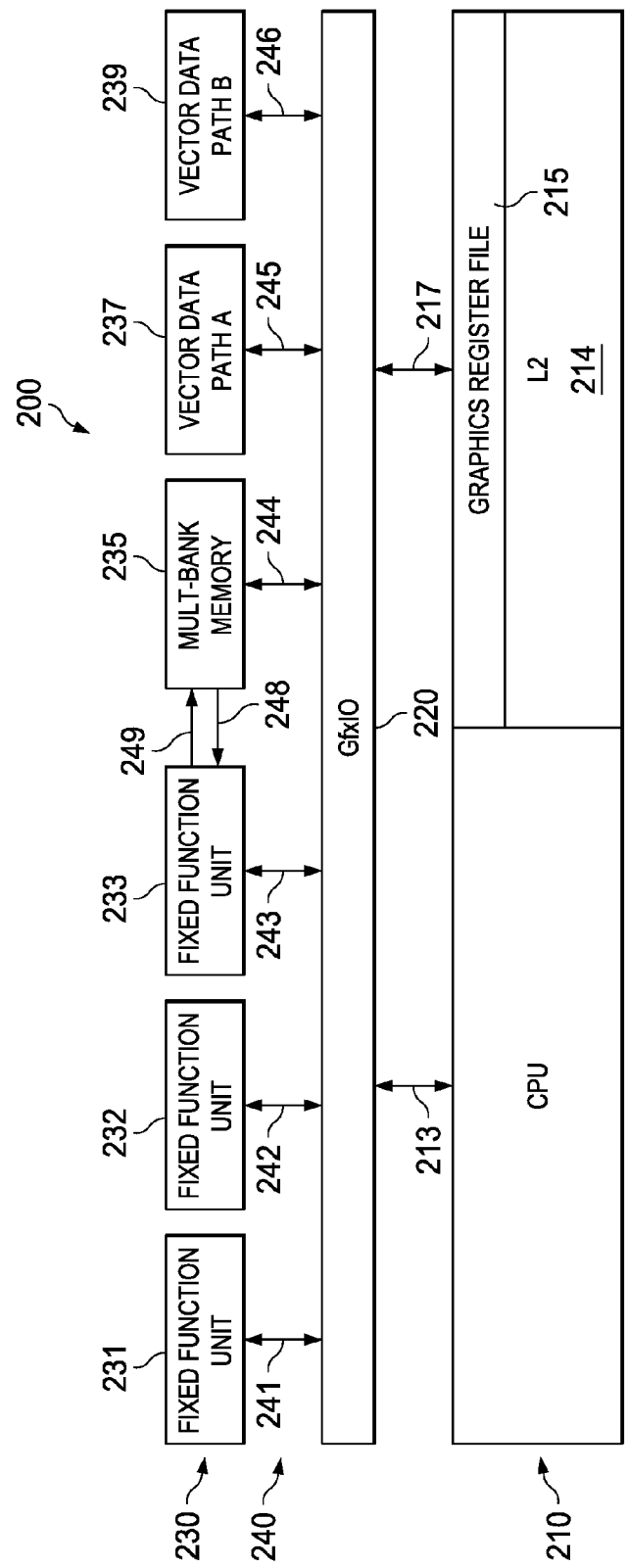
FIG. 2 illustrates a block diagram of an embodiment of a graphics pipeline constructed according to the principles of the disclosure.

FIG. 2 illustrates a block diagram of an embodiment of a programmable graphics pipeline 200 constructed according to the principles of the disclosure. The programmable graphics pipeline 200 includes a general processing unit 210, an IO interface 220 and accelerators 230.

The general processing unit 210 is a standard processing unit having a processing core 212 and a processor memory 214. The processor core 212 is a scalar core that is configured for processing scalar code. The processor memory 214 is incorporated as part of the general processing unit 210. The processor memory 214 is configured to store data to be processed by the processing core 212 or data to be sent to the accelerators 230 for processing. In one embodiment, the processor memory 214 is an L2 cache. In different embodiments, the processor memory 214 is random access memory (RAM) or a scratchpad.

The processor memory 214 includes a graphics register file 215. The graphics register file 215 is configured to include accelerator data including input and output operands for the accelerators 230. The graphics register file 215 is configured to include a file of active vectors of the accelerators 230. An active vector is a vector or vector data presently being processed in the graphics pipeline 200.

The general processing unit 210 is connected to the IO interface 220 via two bi-directional connections. As illustrated in FIG. 2, the processing core 212 is connected to the IO interface 220 via a bi-directional control connection 213 and the processor memory 214 is connected to the IO interface 220 via a bi-directional data connection 217. In one embodiment, the bi-directional control connection 213 and the bi-directional data connection 217 are conventional connectors that are sized, positioned and terminated to at least provide the communications associated therewith that are described herein.

The IO interface 220 is a single interface that connects the general processing unit 210 to the accelerators 230 to form a graphics pipeline. The IO interface 220 includes multiple components that are configured to provide non-permanent connections between the general processing unit 210 and the accelerators 230 and provide the proper conversions to allow communication and processing of requests and responses therebetween. In one embodiment, the IO interface 220 provides dynamic connections between the general processing unit 210 and the accelerators 230 for each request generated by the general processing unit 210. A request is an instruction or command to perform an action or work on data. A request is generated by the processing core 212 for one of the accelerators 230 to perform. A response is generated or provided by one of the particular accelerators 230 as a result of the request. Associated with each request are parameters and state information that the accelerators 230 use to process the requests. In some embodiments, the IO interface 220 is the IO interface 118 of FIG. 1.

The accelerators 230 are hardware implemented units that are configured to accelerate processing of the graphics pipeline 200. The accelerators 230 include three fixed function units 231, 232 and 233. The fixed function units 231, 232, 233, are fixed function units that are typically found in a GPU. Each of the fixed function units 231, 232, 233, is configured with the necessary circuitry dedicated to perform a particular function of a graphics pipeline. In one embodiment, the fixed function units 231, 232 and 233 are a geometry assist stage, a surface assist stage and a texture stage, respectively. One skilled in the art will understand that other types of fixed function units can be employed as accelerators.

The accelerators 230 also include a multi-bank memory 235, a vector data path A denoted as 237 and a vector data path B denoted as 239. In contrast to a programmable function unit implemented on special purpose processor configured to operate highly parallel code, the general processing unit 210 does not include vector data paths or a scratch RAM. Instead, the functionality of these components has been placed external to a programmable processor and placed in a fixed format as accelerators. As such, the processing core 212 issues vector instructions as regular graphics request to the particular vector data path, vector data path A 237 or vector data path B 239. The vector instructions are communicated via the bi-directional control connection 213 to the IO interface 220. The IO interface 220 translates the software format vector instruction into a hardware format for the appropriate vector data path and communicates the vector instruction thereto via an accelerator connection that is specifically dedicated to a single one of the accelerators 230. The dedicated accelerator connections are generally denoted in FIG. 2 as elements 240 and specifically denoted as elements 241, 242, 243, 244, 245 and 246.

In FIG. 2, two of the accelerators, fixed function unit 233 and multi-bank memory 235 are directly coupled together via a unit connector 248 and a unit connector 249. The unit connectors 248, 249, provide access between two different ones of the accelerators 230. For the programmable graphics pipeline 200, the unit connectors 248, 249, provide communication paths to transmit and receive data with the multi-bank memory 235. The unit connectors 248, 249, therefore, can be used to reduce or minimize the cost of graphics pipeline by allowing the multi-bank memory 235 to be shared by the fixed function unit 233. For example, as noted above the fixed function unit 233 can be a texture stage that typically requires a memory allowing highly divergent accesses. With the unit connectors 248, 249, the texture stage can use the multi-bank memory 235 for its texture cache data banks. In one embodiment, the multi-bank memory 235 can be a scratch RAM configured for highly divergent access. In one embodiment, the unit connectors 248, 249, and the dedicated accelerator connections 240 are conventional connectors that are sized, positioned and terminated to at least provide the communications associated therewith that are described herein.

Figure 3:
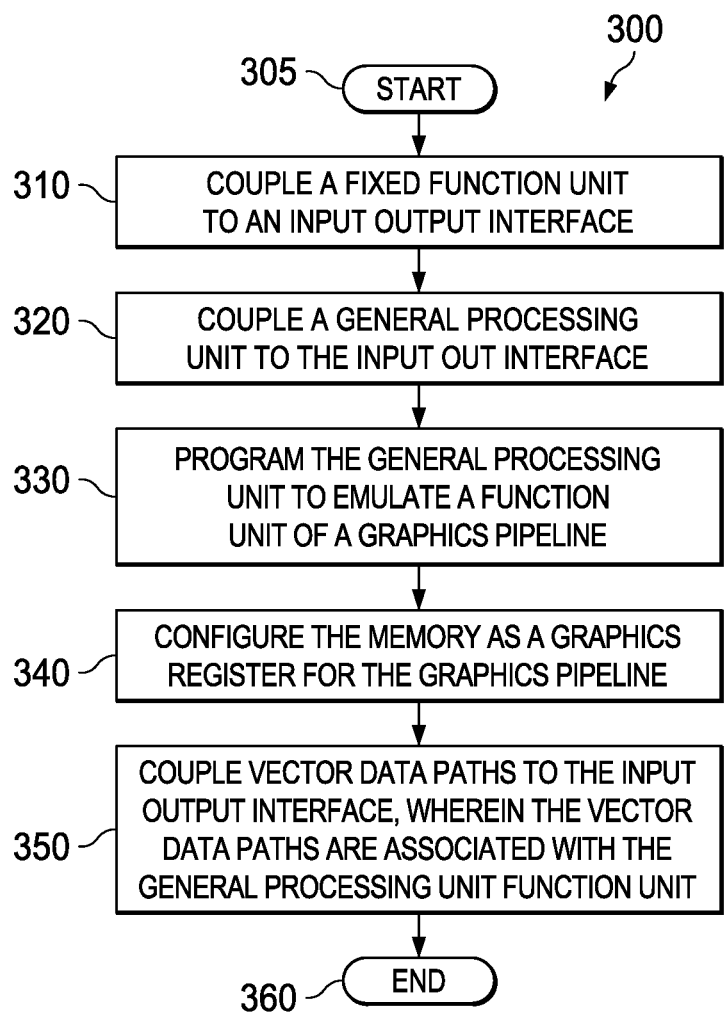
FIG. 3 illustrates a flow diagram of a method of manufacturing a graphics pipeline carried out according to the principles of the disclosure.

FIG. 3 illustrates a flow diagram of a method 300 of manufacturing a graphics pipeline carried out according to the principles of the disclosure. The resulting graphics pipeline can be, for example, the programmable graphics pipeline 200 of FIG. 2 or the graphics pipeline of the GPU 116. The method 300 begins in a step 305.

In a step 310, a fixed function unit is coupled to an input output interface. The input output interface can be the interface 118 or the IO interface 220. In one embodiments, multiple fixed function units are coupled to the input output interface. Each of the fixed function units can be conventional fixed function units.

A general processing unit is coupled to the input output interface in a step 320. In a step 330, the general processing unit is programmed to emulate a function unit of a graphics pipeline. The general processing unit includes a processing core and a processor memory. In one embodiment, the processing core is a scalar core and the processor memory is an L2 cache. Bi-directional control and data connections can be used to couple the input output interface to the general processing unit.

The processor memory is configured as a graphics register for the graphics pipeline in a step 340. In one embodiment only a portion of the processor memory is configured as a graphics register.

In a step 350, vector data paths are coupled to the input output interface. The vector data paths are hardware implemented accelerators associated with the general processing unit function unit. Moving the vector processing out from the processor core of a programmable processing unit allows an off-shelf CPU to be used for a programmable function unit. As such, a streaming multiprocessor can be replaced with a CPU. The method 300 then ends in a step 330.

The disclosed architecture provides many benefits including a lower entry barrier into building a GPU. Since the architecture can employ an existing CPU, many of the complications and details involved in building a custom processor can be avoided. The accelerators are mostly stateless and easier to design and verify than a full processor. On the software side, most of the pipeline emulation code can run on a standard scalar core, which lowers the amount of infrastructure (compilers/debuggers/profilers) needed and makes it easier to achieve acceptable performance than on a custom scalar core.

On the more technical side, the proposed architecture can remove or at least reduce barriers between the CPU and GPU. Switching between scalar and data parallel sections would be done in a few cycles, since the CPU has direct access to all vector registers. As a side benefit, the CPU would have access to all accelerators and could use them directly in otherwise scalar code.

Due to the loose coupling of components in the disclosed architecture, the design is highly modular. Some modifications to the CPU part (to add the control bus) and the memory system (to add the data bus to L2), but the same graphics components could be connected to different CPU implementations to hit different performance ratios. The disclosed architecture provides an unmodified or mostly unmodified core with loosely coupled vector and fixed function accelerators. In some embodiments, modifications include the addition of a control bus to send commands to the accelerators and receive responses. This functionality can be implemented using an existing memory. Nevertheless, a dedicated control bus can increase performance. Modifications can also include pinning the registers of the cache in place and keep them from being evicted.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

A portion of the above-described apparatuses, systems or methods may be embodied in or performed by various, such as conventional, digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions of the apparatuses described herein. As discussed with respect to disclosed embodiments, a general processing unit having a scalar core that is suited for processing scalar code is employed.

Portions of disclosed embodiments may relate to computer storage products with a non-transitory computer-readable medium that have program code thereon for performing various computer-implemented operations that embody a part of an apparatus, system or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. A graphics pipeline, comprising:
   accelerators;
   an input output interface coupled to each of said accelerators; and
   a general processing unit coupled to said input output interface and configured to emulate a programmable function unit of said graphics pipeline, said general processing unit configured to issue vector instructions via said input output interface to vector data paths for said programmable function unit;
   wherein said accelerators include said vector data paths that are external to said general processing unit.

2. The graphics pipeline as recited in claim 1 wherein said general processing unit includes a memory having a graphics register configured to store input and output operands for said vector data paths.

3. The graphics pipeline as recited in claim 2 wherein said memory is a level two cache.

4. The graphics pipeline as recited in claim 2 wherein said general processing unit has direct access to said graphics register.

5. The graphics pipeline as recited in claim 2 wherein said graphics register is configured to store input and output operands for all of said accelerators.

6. The graphics pipeline as recited in claim 1 wherein said general processing unit issues said vector instructions as a request.

7. The graphics pipeline as recited in claim 1 wherein said accelerators include a multi-bank memory.

8. The graphics pipeline as recited in claim 1 wherein said accelerators further include a volatile memory.

9. The graphics pipeline as recited in claim 1 wherein said general processing unit has a standard scalar core.

10. The graphics pipeline as recited in claim 1 wherein said graphics pipeline is modular.

11. The graphics pipeline as recited in claim 1 wherein two of said accelerators are directly coupled together.

12. An apparatus, comprising:
    a scalar processing core programmed to emulate a function unit of a graphics pipeline; and
    a memory directly coupled to said scalar processing core and including a graphics register configured to store input and output operands for accelerators of said graphics pipeline;
    wherein said scalar processing core does not include vector data paths associated with said function unit.

13. The apparatus as recited in claim 12 wherein said accelerators include said vector data paths.

14. The apparatus as recited in claim 12 wherein said memory is a L2 cache.

15. The apparatus as recited in claim 12 wherein said scalar processing core supports one hardware thread context per cooperative thread array.

16. A method of manufacturing a graphics processing unit employing a general processing unit, comprising:
    coupling a fixed function unit to an input output interface;
    coupling a general processing unit to said input output interface;
    programming said general processing unit to emulate a function unit of a graphics pipeline; and
    coupling vector data paths to said input output interface, wherein said general processing unit does not include said vector data paths associated with said function unit.

17. The method as recited in claim 16 wherein said general processing unit includes a memory, said method further comprising configuring said memory as a graphics register for said graphics pipeline.

18. The method as recited in claim 16 further comprising coupling a multi-bank memory to said input output interface, wherein said multi-bank memory is an accelerator of said graphics pipeline.

19. The method as recited in claim 18 further comprising connecting said fixed function unit to said multi-bank memory.

20. The method as recited in claim 16 wherein said general processing unit has a scalar core and said programming is programming said scalar core.

* * * * *